(12) United States Patent
Appleton

(10) Patent No.: US 9,256,254 B2
(45) Date of Patent: Feb. 9, 2016

(54) MOUNTING ASSEMBLY

(71) Applicant: Draeger Safety UK Limited, Blyth (Northumberland) (GB)

(72) Inventor: John James Appleton, Newbiggin By The Sea (GB)

(73) Assignee: Draeger Safety UK Limited, Blyth, Northumberland (GB)

( * ) Notice: Subject to any disclaimer, the term of this patent is extended or adjusted under 35 U.S.C. 154(b) by 30 days.

(21) Appl. No.: 14/013,453

(22) Filed: Aug. 29, 2013

(65) Prior Publication Data

US 2014/0063734 A1    Mar. 6, 2014

(30) Foreign Application Priority Data

Aug. 30, 2012   (GB) .................................. 1215467.0

(51) Int. Cl.
*G06F 1/16* (2006.01)
*F16M 13/02* (2006.01)
*H05K 7/14* (2006.01)

(52) U.S. Cl.
CPC ............. *G06F 1/1632* (2013.01); *F16M 13/02* (2013.01); *H05K 7/14* (2013.01)

(58) Field of Classification Search
CPC ... G06F 1/1601; G06F 1/1616; G06F 1/1632; G06F 1/1613; G06F 1/1626
USPC .......................... 361/679.55, 679.56; 248/918
See application file for complete search history.

(56) References Cited

U.S. PATENT DOCUMENTS

| | | | |
|---|---|---|---|
| 5,144,290 A * | 9/1992 | Honda et al. .................. | 345/156 |
| 5,262,759 A * | 11/1993 | Moriconi et al. ......... | 361/679.29 |
| 5,504,500 A | 4/1996 | Garthwaite et al. | |
| 5,590,021 A * | 12/1996 | Register .................... | 361/679.21 |
| 5,768,163 A * | 6/1998 | Smith, II ........................ | 708/105 |
| 5,769,374 A * | 6/1998 | Martin et al. ............ | 248/221.11 |
| 5,852,545 A | 12/1998 | Pan-Ratzlaff | |
| 5,900,907 A * | 5/1999 | Malloy et al. ................ | 348/14.1 |
| 6,151,206 A | 11/2000 | Kato et al. | |

(Continued)

FOREIGN PATENT DOCUMENTS

| EP | 0509337 A2 | 10/1992 |
|---|---|---|
| EP | 0631221 A2 | 12/1994 |

OTHER PUBLICATIONS

Search Report issued Dec. 17, 2012 in co-pending GB Application No. 1215467.0

(Continued)

*Primary Examiner* — Adrian S Wilson
(74) *Attorney, Agent, or Firm* — DLA Piper LLP (US)

(57) ABSTRACT

There is disclosed a mounting assembly for structurally mounting a peripheral device to a portable computer. The mounting assembly comprises a bracket arranged to be structurally secured to the portable computer and comprising a first coupling; and a second coupling which in use is attached to or part of the peripheral device. The first and second couplings are arranged to be releasably engaged to form a structural connection, such that in use the peripheral device can be structurally mounted to the portable computer. There is also disclosed a portable computing apparatus comprising a portable computer, a peripheral device and a mounting assembly; and a electronic entry control board for mobile telemetry monitoring apparatus comprising a portable computer, a wireless communication unit and a mounting assembly.

16 Claims, 5 Drawing Sheets

(56) References Cited

U.S. PATENT DOCUMENTS

| | | | |
|---|---|---|---|
| 6,239,841 B1* | 5/2001 | Verstockt et al. | 348/373 |
| 6,366,450 B1* | 4/2002 | Janicek | 361/679.41 |
| 6,407,914 B1 | 6/2002 | Helot | |
| 6,416,239 B1* | 7/2002 | Chou et al. | 396/419 |
| 6,418,010 B1* | 7/2002 | Sawyer | 361/679.05 |
| 6,481,681 B1* | 11/2002 | Stunkel et al. | 248/231.31 |
| 6,560,094 B2* | 5/2003 | Schmidt | 361/679.6 |
| 6,587,151 B1 | 7/2003 | Cipolla et al. | |
| 6,667,877 B2* | 12/2003 | Duquette | 361/679.04 |
| 6,716,047 B2* | 4/2004 | Milan | 439/284 |
| 6,778,383 B2* | 8/2004 | Ho | 361/679.04 |
| 7,466,306 B2* | 12/2008 | Connor et al. | 345/169 |
| D630,628 S* | 1/2011 | Kovac | D14/327 |
| 7,899,970 B2* | 3/2011 | Mori | 710/313 |
| 7,952,569 B2* | 5/2011 | Hunt et al. | 345/179 |
| D652,832 S* | 1/2012 | Wu et al. | D14/373 |
| 8,107,228 B2* | 1/2012 | Sassounian | 361/679.26 |
| 8,158,883 B2* | 4/2012 | Soffer | 174/50 |
| 8,885,338 B1* | 11/2014 | Simpson et al. | 361/679.59 |
| 2002/0044216 A1* | 4/2002 | Cha | 348/376 |
| 2002/0080566 A1* | 6/2002 | Kim | 361/681 |
| 2003/0147206 A1 | 8/2003 | Chen | |
| 2005/0141182 A1* | 6/2005 | Ma et al. | 361/683 |
| 2005/0151042 A1 | 7/2005 | Watson | |
| 2005/0154816 A1* | 7/2005 | Liu | 710/303 |
| 2005/0213298 A1* | 9/2005 | Doherty et al. | 361/683 |
| 2006/0092602 A1* | 5/2006 | Hou et al. | 361/679 |
| 2006/0236014 A1* | 10/2006 | Yin et al. | 710/303 |
| 2006/0250767 A1* | 11/2006 | Brophy et al. | 361/686 |
| 2007/0279856 A1* | 12/2007 | Bragg | 361/683 |
| 2009/0009936 A1* | 1/2009 | Neu et al. | 361/679 |
| 2009/0090825 A1* | 4/2009 | Jung et al. | 248/205.1 |
| 2012/0037771 A1* | 2/2012 | Kitchen | 248/223.41 |
| 2013/0021757 A1* | 1/2013 | Shih et al. | 361/727 |

OTHER PUBLICATIONS

Corresponding European Search Report dated Dec. 10, 2013.
Examination Report from corresponding European Application No. 13 181 846.0 dated Jul. 28, 2015.

* cited by examiner

MOUNTING ASSEMBLY

BACKGROUND

The invention relates to a mounting assembly for structurally mounting a peripheral device to a portable computer. In particular, although not exclusively, the invention relates to a mounting assembly for structurally mounting a wireless communication unit to a portable computer of a mobile telemetry monitoring apparatus for monitoring firefighters.

Firefighters and other rescue personnel are often required to enter hazardous environments, such as burning buildings. In such circumstances, each firefighter is provided with a self-contained breathing apparatus (SCBA) which provides breathable gas to the firefighter. The breathing apparatus may be provided with a personal monitoring device which provides information to the firefighter, such as the gas pressure in the breathing apparatus.

To ensure the safety of the firefighters within a firefighting or other hazardous incident, it is also desirable to monitor their status from outside of the incident. This is typically the responsibility of a designated entry control officer. Typically, the entry control officer uses an entry control board (ECB) to record information regarding the firefighters.

Recently, electronic ECBs have been implemented which are able to remotely monitor the breathing apparatus of each firefighter from outside of an incident. Each firefighter is provided with a personal monitoring device which transmits telemetry data such as temperature and the quantity of breathable gas remaining in their breathing apparatus. The ECB typically receives and displays the telemetry data to the entry control officer, and may also send information to the firefighters, such as an evacuation signal activated by the entry control officer.

Previously considered electronic ECB arrangements comprise a laptop computer provided with separate a wireless communication unit connected by a cable. Whilst this arrangement may be satisfactory, since there are two separate units, the ECB may have limited portability.

It is therefore desirable to provide an improved ECB that may have improved portability, and a mounting assembly for mounting a wireless communication unit to a portable computer.

SUMMARY

According to an aspect of the invention there is provided an electronic entry control board for a telemetry monitoring apparatus for monitoring rescue personnel, the electronic entry control board comprising a portable computer having at least one power and/or communication terminal, a bracket structurally secured to the portable computer, the bracket comprising first and second opposing flanges cooperating with opposed faces of the portable computer such that the bracket is engaged around an edge of the portable computer, at least one power and/or communication terminal coupled with the at least one corresponding terminal of the portable computer, and a first coupling and a wireless communication unit for wirelessly communicating with a plurality of portable devices assigned to respective rescue personnel, the wireless communication unit having a second coupling wherein the first and second couplings are arranged to be engaged and disengaged multiple times and are arranged to be disengaged solely by the application of a disengagement force between the wireless communication unit and the portable computer and wherein the first and second couplings are releasably engaged to form a breakaway structural connection such that the wireless communication unit is detachably structurally mounted to the portable computer.

Another exemplary embodiment of the present invention comprises a mounting assembly for structurally mounting a peripheral device to a portable computer, the mounting assembly comprising a bracket arranged to be structurally secured to the portable computer and comprising a first coupling and a second coupling which in use is attached to or part of the peripheral device wherein the first and second couplings are arranged to be releasably engaged to form a structural connection, such that in use the peripheral device can be structurally mounted to the portable computer.

Another exemplary embodiment of the present invention comprises a portable computing apparatus comprising a portable computer a peripheral device and a mounting assembly comprising a bracket arranged to be structurally secured to the portable computer and comprising a first coupling and a second coupling which in use is attached to or part of the peripheral device wherein the first and second couplings are arranged to be releasably engaged to form a structural connection, such that in use the peripheral device can be structurally mounted to the portable computer and wherein the bracket is structurally secured to the portable computer and the second coupling is attached to or part of the peripheral device such that the peripheral device can be detachably mounted to the portable computer.

Another exemplary embodiment of the present invention comprises an electronic entry control board for a telemetry monitoring apparatus comprising a portable computer, a wireless communication unit and a mounting assembly for structurally mounting a peripheral device to a portable computer, the mounting assembly comprising a bracket arranged to be structurally secured to the portable computer and comprising a first coupling and a second coupling which in use is attached to or part of the peripheral device wherein the first and second couplings are arranged to be releasably engaged to form a structural connection, such that in use the peripheral device can be structurally mounted to the portable computer and wherein the bracket is structurally secured to the portable computer and the second coupling is attached to or part of the wireless communication unit such that the wireless communication unit can be detachably mounted to the portable computer.

BRIEF DESCRIPTION OF THE DRAWINGS

For a better understanding of the invention and to show more clearly how it may be carried into effect, reference will now be made, by way of example, to the accompanying drawings in which.

DETAILED DESCRIPTION

Figure 1:
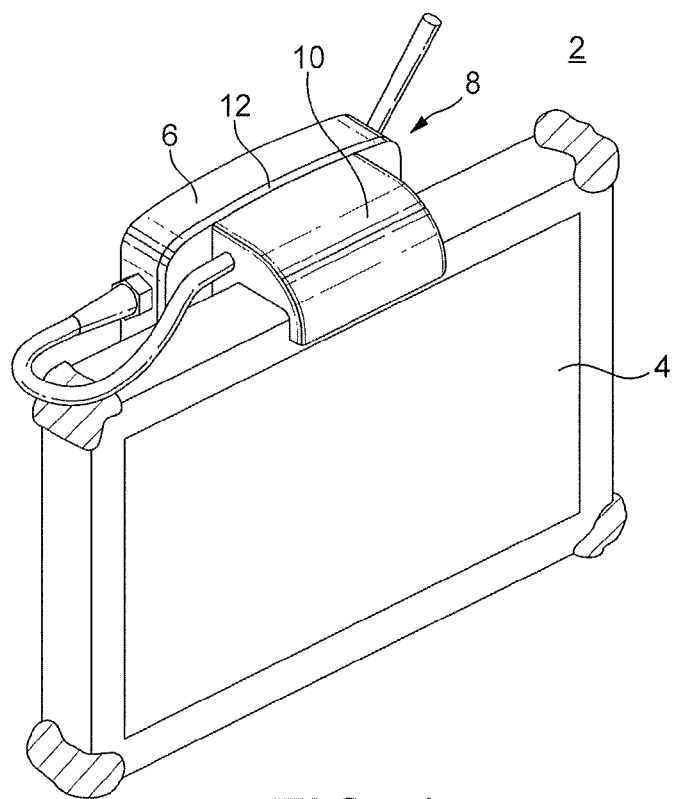
FIG. 1 is a perspective view of a mobile telemetry monitoring apparatus, generally showing the front side of the apparatus.

In accordance with an aspect of the invention there is provided a mounting assembly for structurally mounting a peripheral device, such as a wireless communication unit, to a portable computer, such as a tablet computer, the mounting assembly comprising: a bracket arranged to be structurally secured to the portable computer and comprising a first coupling; and a second coupling which in use is attached to or part of the peripheral device; wherein the first and second couplings are arranged to be releasably engaged to form a structural connection, such that in use the peripheral device can be structurally mounted to the portable computer. This allows the peripheral device to be easily and quickly attached and detached from the portable computer.

The first and second couplings may be arranged to be releasably engaged to form a breakaway connection. This may mean that the connection between the wireless communication unit and the portable computer can be broken with relative ease. The first and second couplings may be arranged to be disengaged solely by the application of a disengagement force between the peripheral device and the portable computer. The first and second couplings may be arranged to be engaged and disengaged multiple times. In other words, disengagement of the first and second couplings does not destroy the integrity of either of the couplings. The first and second couplings may be arranged to cooperate with one another to form a snap-fit connection. The first or second coupling may comprise a detent, and the other coupling may comprise a corresponding recess. There may be a plurality of first couplings, and a corresponding number of second couplings. For example, there may be two first couplings and two second couplings.

The or each detent may be provided on a resiliently deformable spring protrusion. The detent may be provided on a hook-shaped end of the spring protrusion.

The bracket may be arranged to engage around an edge of the portable computer. The bracket may comprise first and second opposing flanges for cooperating with corresponding opposed faces of the portable computer. The first and second flanges may define a substantially U-shaped channel having an internal profile that corresponds with the profile of the edge of the portable computer. One of the flanges may comprise one or more protrusions for engaging with one or more corresponding recesses provided in the portable computer. The flange may comprise a plurality of protrusions for engaging with corresponding recesses provided in the portable computer. The flanges may be configured to bear and transmit load to the body of the portable computer.

The bracket may comprise at least one power and/or communication terminal for coupling with at least one corresponding terminal of the portable computer when the bracket is secured to the portable computer. The mounting assembly may further comprise a cable coupled to the at least one terminal at one end and arranged to be coupled to the peripheral device at an opposing end. The cable may comprise a connector arranged to be detachably coupled to the peripheral device. This may allow the portable computer to supply power and/or exchange data with the portable device.

In accordance with a further aspect of the invention there is provided a portable computing apparatus comprising: a portable computer, such as a tablet computer; a peripheral device, such as a wireless communication unit; and a mounting assembly in accordance with any statement herein, wherein the bracket is structurally secured to the portable computer and the second coupling is attached to or part of the peripheral device such that the peripheral device can be detachably mounted to the portable computer.

In accordance with a further aspect of the invention there is provided an electronic control board for a telemetry monitoring apparatus comprising: a portable computer, such as a tablet; a wireless communication unit; and a mounting assembly in accordance with any statement herein, wherein the bracket is structurally secured to the portable computer, and wherein the second coupling is attached to or part of the wireless communication unit such that the wireless communication unit can be detachably mounted to the portable computer.

The second coupling may be part of an adapter plate detachably secured to the wireless communication unit.

Figure 2:
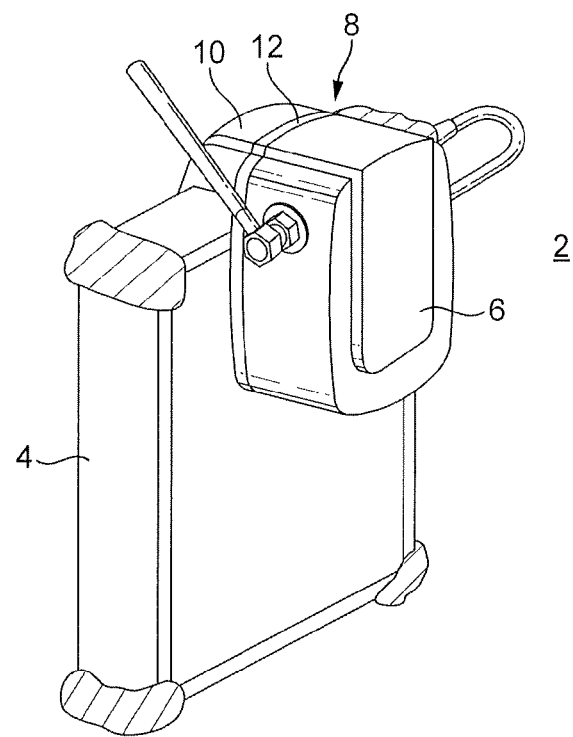
FIG. 2 is a perspective view of the mobile telemetry monitoring apparatus of FIG. 1, generally showing the rear side of the apparatus.

Referring to FIGS. 1 and 2, there is shown an electronic entry control board (ECB) 2 of a mobile telemetry monitoring apparatus for monitoring firefighters. The ECB 2 comprises a portable computer 4, in the form of a ruggedized tablet computer, and a wireless communication unit 6. There is also provided a mounting assembly 8 for structurally mounting the wireless communication unit 6 to the tablet 4. The mounting assembly 8 comprises a bracket 10 which is secured to the tablet 4 and an adapter plate 12 which is secured to the wireless communication unit 6. The bracket 10 and the adapter plate 12 are arranged to be detachably attached together to form a snap-fit connection so that the wireless communication unit 6 can be structurally mounted to the tablet 4. As will be described in detail below, by applying a force between the tablet 4 and the wireless communication unit 6 the bracket 10 and the adapter plate 12 can be separated to detach the wireless communication unit 6 from the tablet 4.

The bracket 10 comprises power and data terminals 14 (FIG. 4) which engage with corresponding terminals 16 of the tablet 4 when the bracket 10 is secured to the tablet 4. A cable 18 is provided which extends between the bracket terminals 14 and the wireless communication unit 6 to provide a power and data connection between the tablet 4 and the wireless communication unit 6.

During a firefighting incident, each firefighter is provided with a personal monitoring device (not shown), associated with their breathing apparatus, which is logged onto the ECB 2. The personal monitoring device monitors and periodically wirelessly transmits telemetry data, such as temperature and gas pressure to the wireless communication unit 6 of the ECB 2. An entry control officer uses the ECB 2 to monitor the firefighters, and may also send information, such as an evacuation signal, to one or more firefighters by transmitting data from the wireless communication unit 6 of the ECB 2.

The ECB 2 may be exposed to forces which stress the attachment of the wireless communication unit 6 to the tablet 4. These forces may be caused by accidentally dropping the ECB 2, for example. In this embodiment, the mounting assembly 8 is configured such that the adapter plate 12 and bracket 10 preferentially disengage under high forces so as to structurally separate the wireless communication unit 6 from the tablet 4. This may prevent the structural and power/data connections of the tablet 4 and wireless communication unit 6 from experiencing excessively high forces which could damage the equipment.

The mounting assembly 8 will now be described in detail below.

Figure 3:
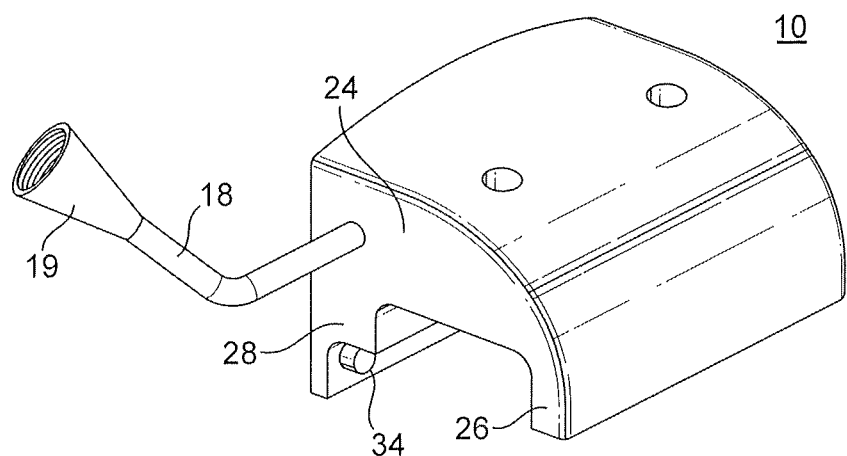
FIG. 3 is a perspective view of the bracket of the mounting assembly of FIG. 1.
Figure 4:
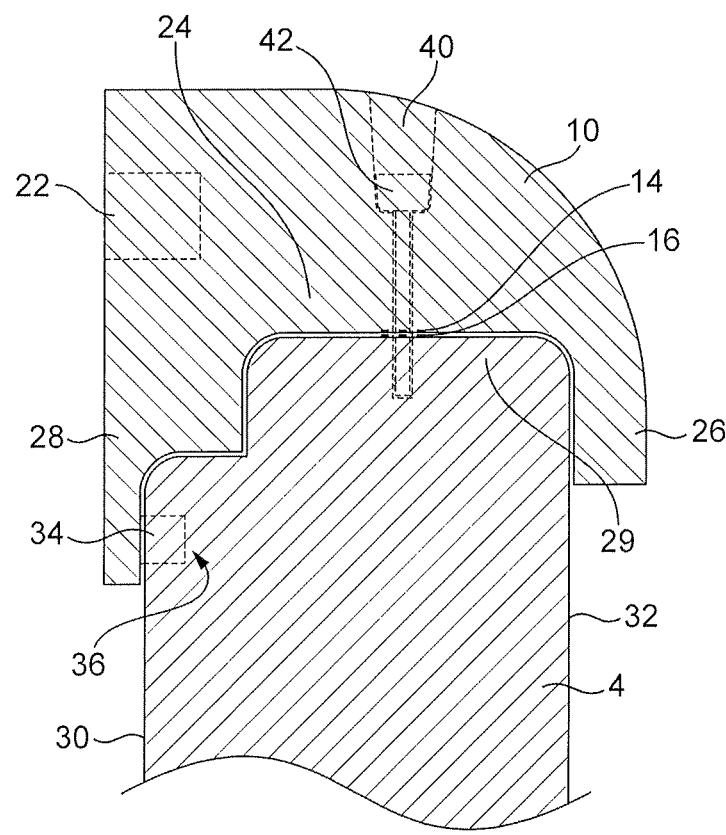
FIG. 4 is a cross-sectional side view through the bracket of FIG. 3 secured to a portable computer.

As shown in FIGS. 3 and 4, the bracket 10 comprises a central portion 24 and front and rear substantially parallel flanges 26, 28 which define a U-shaped channel having an internal profile shaped to cooperate with the upper edge of the tablet 4. The front and rear flanges 26, 28 are arranged to cooperate with front and rear faces 32, 30 of the tablet 4, and the central portion 24 is arranged to cooperate with the upper side wall 29 of the tablet 4. The rear flange 28 is provided with two spaced-apart protrusions 34 that project inwardly into the channel. The protrusions 34 are arranged to locate within corresponding recesses 36 formed in the upper portion of the rear face 30 of the tablet 4.

The underside of the central portion 24 of the bracket 10 is provided with power and data terminals 14 in the form of surface contact pins arranged to couple with corresponding data and power terminals 16 provided on the upper side wall 29 of the tablet 4. The terminals 14 are also connected to a power and data cable 18. The distal end of the cable 18 has a USB connector and a threaded bonnet 19 for connecting to the wireless communication unit 6. The bracket 10 is provided with two countersunk through-holes 40 either side of the terminals 14 through which connecting screws 42 can pass to secure the bracket 10 to the tablet 4.

The bracket 10 is secured to the tablet 4 by clipping it over the upper edge of the tablet 4 with the protrusions 34 of the rear flange 28 received in pre-formed holes 36 on the rear side of the tablet 4. The upper edge of the tablet 4 is received in the U-shaped channel with the front and rear flanges 26, 28 abutting the front and rear faces 32, 30 of the tablet 4, and the central portion 24 abutting the upper side edge of the tablet 4. As can be seen, the contours of the bracket 10 closely conform with those of the tablet 4. With the bracket 10 secured to the tablet 4, the power and data terminals 14, 16 of the bracket 10 and tablet 4 are aligned and coupled together. Two screws 42 are then passed through the countersunk holes 40 in the central portion 24 of the bracket 10, and driven into corresponding tapped holes on the upper side wall 29 of the tablet 4 to secure the bracket 10 in place.

The rear side of the bracket 10 is also provided with two coupling recesses 22 for receiving corresponding spring protrusions 20 of the adapter plate 12 which will be described in detail below. Each recess has a necked opening 38 which is slightly narrower than the widest part of a corresponding spring protrusion 20 formed on the adapter plate 12.

Figure 5:
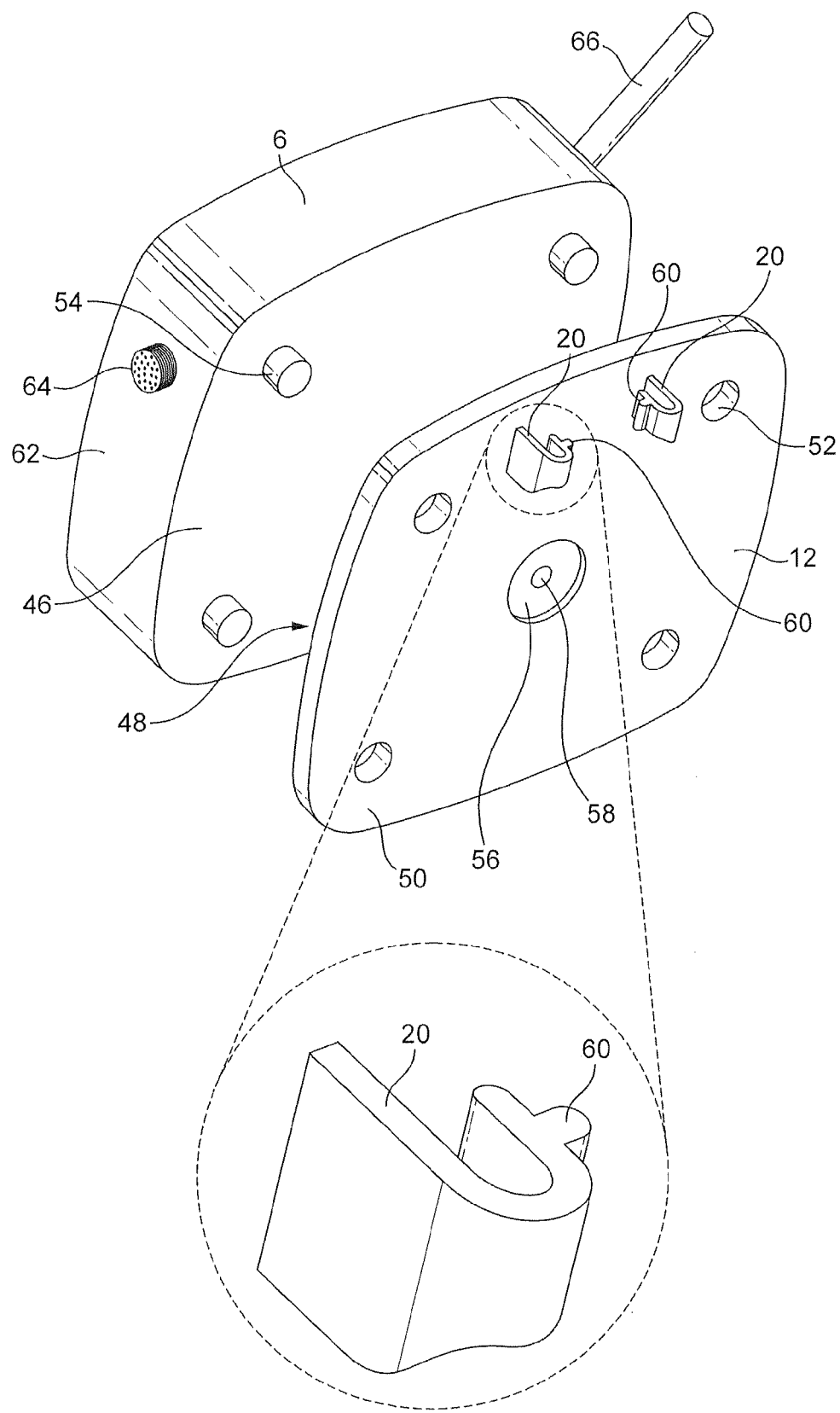
FIG. 5 is a perspective view of the adapter plate of the mounting assembly of FIG. 1 together with a wireless communication unit.

FIG. 5 shows a wireless communication unit 6 and an adapter plate 12 in exploded view. The wireless communication unit 6 comprises a body 62 housing electronic components, power and data terminals 64 provided on one side of the body 62, and an antenna 66 provided on the opposite side of the body. The base 46 of the wireless communication unit 6 is provided with four locating protrusions 54 arranged to cooperate with the adapter plate 12.

The adapter plate 12 is a generally flat plate having substantially the same profile as the base 46 of the wireless communication unit 6. The rear face 48 of the adapter plate 12 is arranged to conform with the base 46 of the wireless communication unit 6 and comprises four through-holes 52 for receiving the corresponding locating protrusions 54. The adapter plate 12 is also provided with a central countersunk through-hole 56 through which a connecting screw 58 can be passed to secure the adapter plate 12 to the wireless communication unit 6.

The front face 50 of the adapter plate 12 is provided with two resiliently deformable coupling spring protrusions 20. Each spring protrusion 20 comprises a plastically deformable arm which protrudes from the adapter plate 12 in a direction normal to the front face 50 and has a hook-shaped end provided with a detent 60 which is tapered in two directions. The end of the spring protrusion can be resiliently compressed (i.e. by deflecting the hook-shaped end) so as to reduce the width of the spring protrusion 20. In its uncompressed state, the width of the end of the spring protrusion 20 is wider than that of the necked opening 38 of the recess 22, and must be compressed in order to insert it into the recess 22.

The adapter plate 12 is secured to the wireless communication unit 6 by aligning and inserting the protrusions 54 on the base 46 of the wireless communication unit 6 into the through-holes 52 of the adapter plate 12. A screw 58 is then passed through the countersunk hole 56 of the adapter plate into a corresponding tapped hole (not shown) in the wireless communication unit 6 to secure the adapter plate 12 to the wireless communication unit 6.

Figure 6:
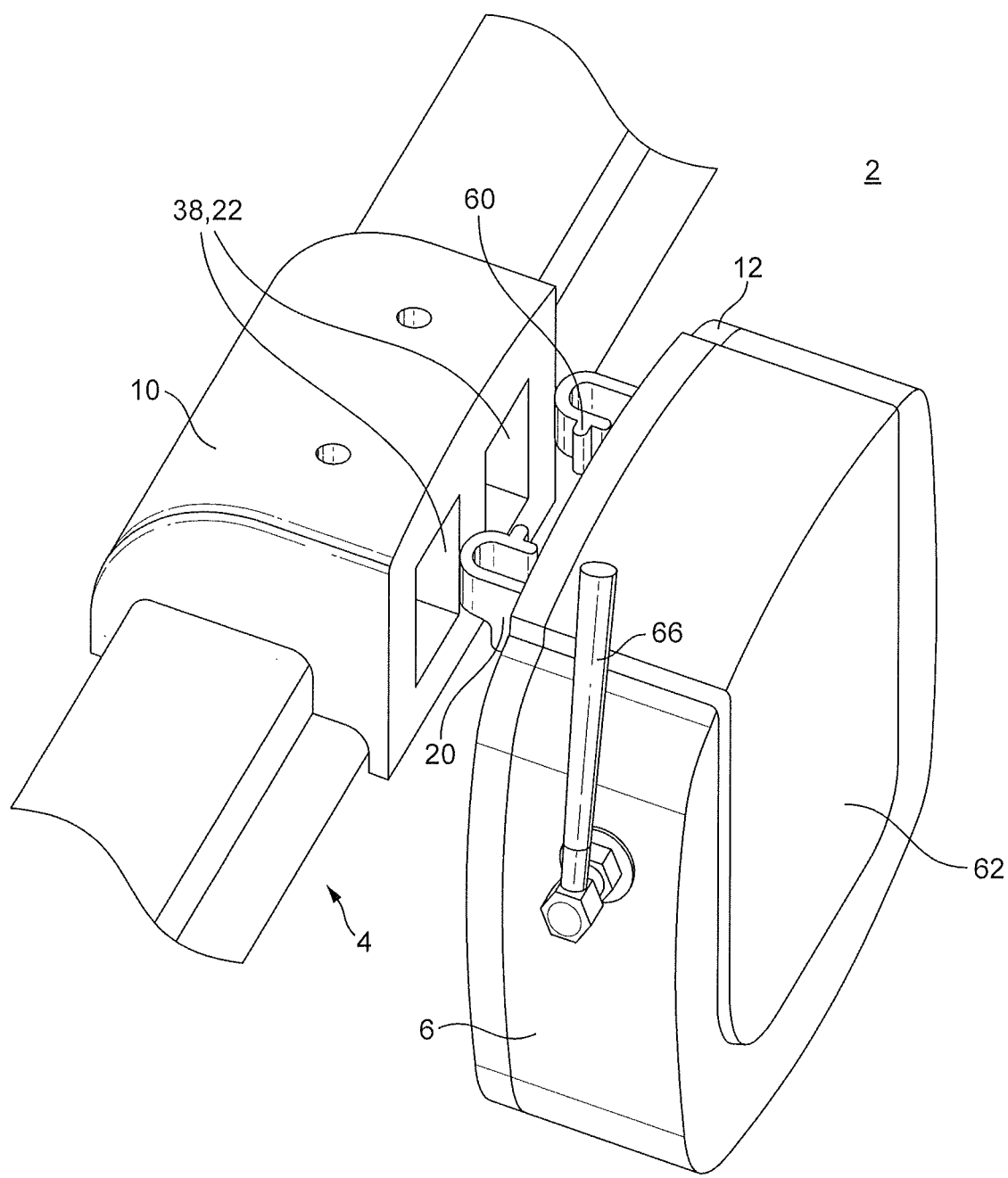
FIG. 6 is a perspective view of the mobile telemetry monitoring apparatus of FIG. 1 with the wireless communication unit detached from the portable computer.
Figure 7:
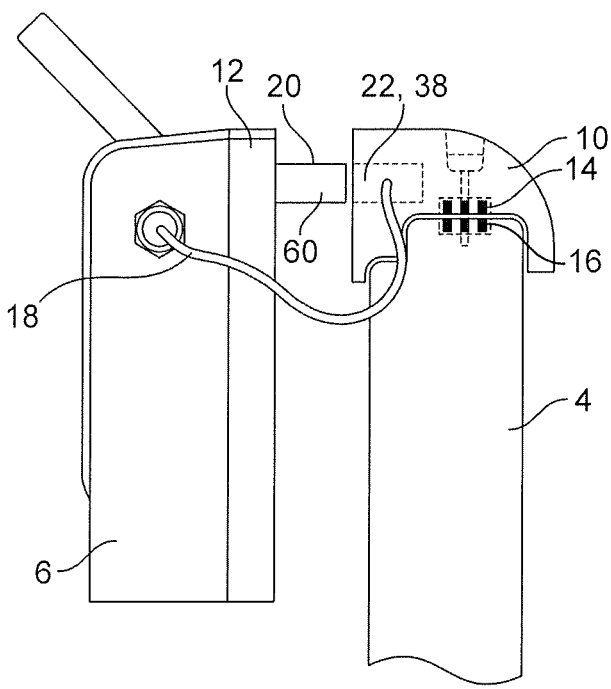
FIG. 7 is a side view of the mobile telemetry monitoring apparatus of FIG. 1 with the wireless communication unit detached from the portable computer.
Figure 8:
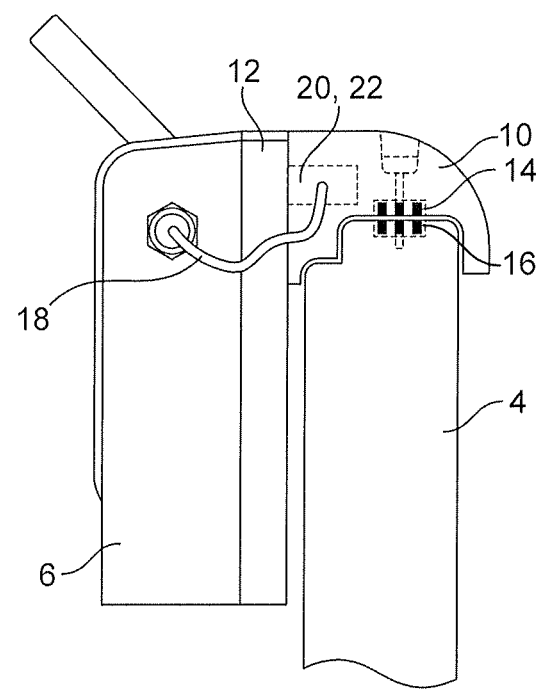
FIG. 8 is a side view of the mobile telemetry monitoring apparatus shown in FIG. 7 with the wireless communication unit structurally mounted to the portable computer.

With reference to FIGS. 6-8, in normal use the bracket 10 is permanently secured to the tablet 4 and the adapter plate 12 is permanently secured to the wireless communication unit 6. The bracket 10 and adapter plate 12 are said to be permanently secured since they are not intended to be detached from the tablet and/or peripheral device. In order to structurally mount the wireless communication unit 6 to the tablet 4 the spring protrusions 20 of the adapter plate 12 are aligned with the recesses 22 of the bracket 10, and the wireless communication unit 6 and the tablet 4 are pushed together such that the spring protrusions 20 engage with the recesses 22 to form a snap-fit structural connection. The hooked end of each spring protrusion 20 is wider than the necked opening 38 of the corresponding recess 22, and therefore the hooked end is resiliently compressed as the wireless communication unit 6 and tablet 4 are pushed together. Once the detents 60 on the hooked ends have passed the necked openings 38 of the recesses 22, the hooked ends return to their uncompressed state in the recesses 22 and the snap-fit connection is made, thereby mounting the wireless communication unit 6 to the tablet 4.

The connector at the free end of the cable 18 is connected to the power and data terminal 64 of the wireless communication unit 6, and is secured thereto by the threaded bonnet 19.

The assembled ECB 2 may then be used by an entry control officer to monitor firefighters. The entry control officer typically supports the ECB 2 on their forearm, using the lower side of the wireless communication unit 6 as a supporting ledge. The moment exerted on the mounting assembly by supporting the ECB 2 in this position is resisted by the abutment of the flanges 26, 28 against the front and rear faces 32, 30 of the tablet 4, and by the protrusions 34 received within the pre-formed holes 36. The flanges 26, 28 and protrusions 34 therefore bear and transmit load directly to the body of the tablet 4, thereby reducing the load transmitted from the mounting assembly 8 to the tablet 4 via the screws 42.

The wireless communication unit 6 can be separated from the tablet 4 without breaking the power and data connection by simply pulling and/or rotating the wireless communication unit 6 apart from the tablet 4 with sufficient force to disengage the spring protrusions 20 from the corresponding recesses 22. As the disengaging force is applied, the detent 60 cooperates with the necked opening 38 of the recess 22 to resiliently compress the end of the spring protrusion 20 and allow the spring protrusion 20 to be withdrawn from the recess 22 through the necked opening 38. Despite the structural disengagement, the power and data connection is maintained by the cable 18.

In some circumstances it may be desirable to detach the wireless communication unit 6 from the tablet 4 so that the wireless communication unit 6 can be positioned in the optimum location for wireless communication. For example, it may be desirable to position the wireless communication unit on a tripod or stand.

The ECB 2 may be subjected to unintentional loads which tend to stress the connection between the wireless communication unit 6 and the tablet 4, for example, if the ECB 2 is dropped. In such instances, if there is sufficient force to disengage the spring protrusions 20 from the recesses 22, then the adapter plate 12 will simply be released from the bracket 10 without damaging the components.

The connection between the adapter plate 12 and bracket 10 can be referred to as a preferential breakaway connection. The connection is a breakaway connection because the adapter plate 12 breaks away from the bracket 10 solely by the application of a force which tends to pull and/or rotate the two apart. The connection is a preferential breakaway connection because it is configured to be weaker than other connections such that it disengages at a lower load than those other connections. This may protect other connections from exposure to excessively high forces.

The mounting assembly provides the benefit of a fail-safe connection which may allow the ECB 2 to continue functioning if the ECB is dropped and the wireless communication unit 6 becomes structurally disengaged from the tablet 4. The ECB 2 can still function even if the wireless communication unit 6 and tablet 4 are detached from one another as the power/data cable 18 remains in place. The mounting assembly ensures that when the structural connection between the wireless communication unit 6 and the tablet 4 is stressed, it disengages in a predictable way without causing damage to the structural and power/data connections between the bracket 10 and the tablet 4, and between the adapter plate 12 and the wireless communication unit 6.

Although embodiments of the invention have been described in which the mounting assembly uses first and second couplings in the form of corresponding detents and recesses, it should be appreciated that any suitable couplings can be used.

It should be appreciated that the adapter plate 12 is provided to allow any device, such as the wireless communication unit 6, to be connected to the bracket 10, thereby mounting the device to the tablet 4. Accordingly, different adapter plates configured to conform with and be secured to different peripheral devices can be provided. However, each adapter plate will have a common coupling for making a connection with the bracket, such that any peripheral devices can be mounted to the tablet by simply using a different adapter plate. Any suitable peripheral device could be mounted, for example, a gas detector.

Further, although embodiments of the invention have been described in which the second coupling is provided on an adapter plate, it should be appreciated that the second coupling could be a part of the peripheral device itself. For example, the second coupling could be directly attached to or integrally formed with the peripheral device.

Although the invention has been described in terms of exemplary embodiments, it is not limited thereto. Rather, the appended claims should be construed broadly to include other variants and embodiments of the invention which may be made by those skilled in the art without departing from the scope and range of equivalents of the invention. This disclosure is intended to cover any adaptations or variations of the embodiments discussed herein.

The invention claimed is:

1. An electronic entry control board for a telemetry monitoring apparatus for monitoring rescue personnel, the electronic entry control board comprising:
    a portable computer having at least one power and/or communication terminal;
    a bracket structurally secured to the portable computer, the bracket comprising:
        first and second opposing flanges cooperating with opposed faces of the portable computer such that the bracket is engaged around an edge of the portable computer;
        at least one power and/or communication terminal coupled with the at least one corresponding terminal of the portable computer; and
        a first coupling; and
    a wireless communication unit for wirelessly communicating with a plurality of portable devices assigned to respective rescue personnel, the wireless communication unit having a second coupling;
    wherein the first and second couplings are releasably engaged to form a breakaway structural connection such that the wireless communication unit is detachably structurally mounted to the bracket;
    wherein the bracket further comprises at least one power and/or communication terminal for coupling with at least one corresponding terminal of the portable computer when the bracket is secured to the portable computer; and
    wherein the the electronic entry control board further comprises a cable coupled to the at least one power and/or communication terminal and configured to be coupled to the wireless communication unit, the cable comprising a connector configured to be detachably attached to the wireless communication unit; and
    wherein the connection between the first and second couplings is configured to be weaker than the structural connection between the bracket and the portable computer, such that in use the bracket and wireless communication unit can be disengaged without causing damage to (i) the structural connection and (ii) the power and/or data connection between the bracket and the portable computer.

2. A mounting assembly for structurally mounting a peripheral device to a portable computer, the mounting assembly comprising:
    a bracket arranged to be structurally secured to the portable computer and comprising a first coupling; and
    a second coupling which in use is attached to or part of the peripheral device;
    wherein the first and second couplings are arranged to be releasably engaged with each other to form a structural connection, such that in use the peripheral device can be structurally mounted to the bracket;
    wherein the bracket further comprises at least one power and/or communication terminal for coupling with at least one corresponding terminal of the portable computer when the bracket is structurally secured to the portable computer;
    wherein the first and second couplings are configured to form a connection which is weaker than a structural connection between the bracket and the portable computer when the bracket is structurally secured to the portable computer, such that in use the bracket and peripheral device can be disengaged without causing damage to (i) the structural connection and (ii) the power and/or data connection between the bracket and the portable computer; and wherein the mounting assembly further comprises a cable coupled to the at least one power and/or communication terminal and configured to be coupled to the peripheral device, the cable comprising a connector configured to be detachably attached to the peripheral device.

3. A mounting assembly according to claim 2, wherein the first and second couplings are arranged to be releasably engaged to form a breakaway connection.

4. A mounting assembly according to claim 2, wherein the first and second couplings are arranged to be disengaged solely by the application of a disengagement force between the peripheral device and the portable computer.

5. A mounting assembly according to claim 2, wherein the first and second couplings are arranged to be engaged and disengaged multiple times.

6. A mounting assembly according to claim 2, wherein the first and second couplings are arranged to cooperate with one another to form a snap-fit connection.

7. A mounting assembly according to claim 2, wherein the first or second coupling comprises a detent, and wherein the other comprises a corresponding recess.

8. A mounting assembly according to claim 2, wherein there are a plurality of first couplings, and a corresponding number of second couplings.

9. A mounting assembly according to claim 2, wherein the bracket is arranged to engage around an edge of the portable computer.

10. A mounting assembly according to claim 2, wherein the bracket comprises first and second opposing flanges for cooperating with corresponding opposed faces of the portable computer.

11. A mounting assembly according to claim 10, wherein one of the flanges comprises a protrusion for engaging with a corresponding recess provided in the portable computer.

12. A mounting assembly according to claim 2, wherein the bracket comprises at least one power and/or communication terminal for coupling with at least one corresponding terminal of the portable computer when the bracket is secured to the portable computer.

13. A mounting assembly according to claim 12, further comprising a cable coupled to the at least one terminal and arranged to be coupled to the peripheral device, the cable comprising a connector arranged to be detachably attached to the peripheral device.

14. A portable computing apparatus comprising:
a portable computer;
a peripheral device; and
a mounting assembly comprising:
a bracket structurally secured to the portable computer and comprising a first coupling; and
a second coupling attached to or part of the peripheral device;
wherein the first and second couplings are arranged to be releasably engaged with each other to form a structural connection, such that in use the peripheral device can be structurally mounted to the bracket;
wherein the bracket further comprises at least one power and/or communication terminal coupled with at least one corresponding terminal of the portable computer when the bracket is structurally secured to the portable computer;
wherein the first and second couplings are configured to form a connection which is weaker than a structural connection between the bracket and the portable computer, such that in use the bracket and peripheral device can be disengaged without causing damage to (i) the structural connection and (ii) the power and/or data connection between the bracket and the portable computer; and
wherein the mounting assembly further comprises a cable coupled to the at least one power and/or communication terminal and configured to be coupled to the peripheral device, the cable comprising a connector configured to be detachably attached to the peripheral device.

15. An electronic entry control board for a telemetry monitoring apparatus comprising:
a portable computer;
a wireless communication unit; and
a mounting assembly for structurally mounting the wireless communication unit to the portable computer, the mounting assembly comprising:
a bracket structurally secured to the portable computer and comprising a first coupling; and
a second coupling attached to or part of the wireless communication unit;
wherein the first and second couplings are arranged to be releasably engaged with each other to form a structural connection, such that in use the wireless communication unit can be structurally mounted to the bracket; and
wherein the bracket further comprises at least one power and/or communication terminal coupled with at least one corresponding terminal of the portable computer when the bracket is structurally secured to the portable computer;
wherein the first and second couplings are configured to form a connection which is weaker than the structural connection between the bracket and the portable, such that in use the bracket and wireless communication unit can be disengaged without causing damage to (i) the structural connection and (ii) the power and/or data connection between the bracket and the portable computer; and
wherein the mounting assembly further comprises a cable coupled to the at least one power and/or communication terminal and configured to be coupled to the wireless communication unit, the cable comprising a connector configured to be detachably attached to the wireless communication unit.

16. An electronic entry control board according to claim 15, wherein the second coupling is part of an adapter plate detachably secured to the wireless communication unit.

* * * * *